US011199672B1

(12) United States Patent
Holt et al.

(10) Patent No.: US 11,199,672 B1
(45) Date of Patent: Dec. 14, 2021

(54) MULTIPLE WAVEGUIDE COUPLING TO ONE OR MORE PHOTODETECTORS

(71) Applicant: GLOBALFOUNDRIES U.S. Inc., Santa Clara, CA (US)

(72) Inventors: Judson Holt, Ballston Lake, NY (US); Yusheng Bian, Ballston Lake, NY (US); Andreas D. Stricker, Essex Junction, VT (US); Colleen Meagher, Beacon, NY (US); Michal Rakowski, Ballston Spa, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/901,509

(22) Filed: Jun. 15, 2020

(51) Int. Cl.
*G02B 6/42* (2006.01)
*H01L 31/0232* (2014.01)
*G02B 6/12* (2006.01)
*G02B 6/13* (2006.01)
*H01L 31/18* (2006.01)
*H01L 31/028* (2006.01)

(52) U.S. Cl.
CPC ....... *G02B 6/4295* (2013.01); *G02B 6/12004* (2013.01); *G02B 6/13* (2013.01); *H01L 31/028* (2013.01); *H01L 31/02327* (2013.01); *H01L 31/1808* (2013.01); *G02B 2006/12061* (2013.01); *G02B 2006/12121* (2013.01)

(58) Field of Classification Search
None
See application file for complete search history.

(56) References Cited

U.S. PATENT DOCUMENTS

| 10,910,503 | B1* | 2/2021 | Bian | G02B 6/12004 |
| 2003/0161571 | A1* | 8/2003 | Davids | G02B 6/4214 |
| | | | | 385/14 |
| 2004/0179782 | A1* | 9/2004 | Kimerling | G02B 6/12004 |
| | | | | 385/39 |
| 2004/0185386 | A1* | 9/2004 | Block | G02B 6/12004 |
| | | | | 430/321 |
| 2005/0169593 | A1* | 8/2005 | Hwang | G02B 6/12004 |
| | | | | 385/131 |
| 2007/0104441 | A1* | 5/2007 | Ahn | H01L 31/105 |
| | | | | 385/129 |
| 2009/0324164 | A1* | 12/2009 | Reshotko | G02B 6/42 |
| | | | | 385/14 |

(Continued)

FOREIGN PATENT DOCUMENTS

WO WO 2020/103395 A1 * 5/2020
WO WO 2020/245988 A1 * 12/2020

OTHER PUBLICATIONS

D. Ahn et al. High performance, waveguide integrated Ge photodetectors. Optics Express, 15:7:3916-3921, Apr. 2, 2007. (Year: 2007).*

(Continued)

*Primary Examiner* — Michael Stahl
(74) *Attorney, Agent, or Firm* — Thompson Hine LLP; Anthony Canale

(57) ABSTRACT

Structures for a photodetector and methods of fabricating a structure for a photodetector. A photodetector may have a light-absorbing layer comprised of germanium. A waveguide core may be coupled to the light-absorbing layer. The waveguide core may be comprised of a dielectric material, such as silicon nitride. Another waveguide core, which may be comprised of a different material such as single-crystal silicon, may be coupled to the light-absorbing layer.

20 Claims, 9 Drawing Sheets

(56) References Cited

U.S. PATENT DOCUMENTS

| | | | | |
|---|---|---|---|---|
| 2010/0330727 | A1* | 12/2010 | Hill | G02F 1/025 438/69 |
| 2012/0251034 | A1* | 10/2012 | Chen | G02B 6/12004 385/14 |
| 2018/0138350 | A1* | 5/2018 | Nada | H01L 31/035272 |
| 2019/0319139 | A1* | 10/2019 | Cho | H01L 31/1804 |
| 2020/0081202 | A1* | 3/2020 | Thompson | G02B 6/305 |
| 2020/0124791 | A1* | 4/2020 | Bayn | G02B 6/1228 |

OTHER PUBLICATIONS

Colleen Meagher et al., "Trench-Based Optical Components for Photonics Chips", filed Oct. 9, 2019 as U.S. Appl. No. 16/597,323.

Avijit Chatterjee, Saumitra, Sujit Kumar Sikdar, and Shankar Kumar Selvaraja, "High-speed waveguide integrated silicon photodetector on a SiN-SOI platform for short reach datacom," Opt. Lett. 44, 1682-1685 (2019).

S. Yanikgonul, V. Leong, J. R. Ong, C. E. Png and L. Krivitsky, "Simulation of Silicon Waveguide Single-Photon Avalanche Detectors for Integrated Quantum Photonics," in IEEE Journal of Selected Topics in Quantum Electronics, vol. 26, No. 2, pp. 1-8, Mar.-Apr. 2020, Art No. 6300108, doi: 10.1109/JSTQE.2019.2938439.

Yun Gao, Guodong Zhou, Ni Zhao, Hon Ki Tsang, and Chester Shu, "High-performance chemical vapor deposited graphene-on-silicon nitride waveguide photodetectors," Opt. Lett. 43, 1399-1402 (2018).

K. Giewont et al., "300-mm Monolithic Silicon Photonics Foundry Technology," in IEEE Journal of Selected Topics in Quantum Electronics, vol. 25, No. 5, pp. 1-11, Sep.-Oct. 2019, Art No. 8200611, doi: 10.1109/JSTQE.2019.2908790.

* cited by examiner

MULTIPLE WAVEGUIDE COUPLING TO ONE OR MORE PHOTODETECTORS

BACKGROUND

The present invention relates to photonics chips and, more particularly, to structures for a photodetector and methods of fabricating a structure for a photodetector.

Photonics chips are used in many applications and systems, such as data communication systems and data computation systems. A photonics chip integrates optical components, such as waveguides, grating couplers, and optical switches, and electronic components, such as field-effect transistors, into a unified platform. Among other factors, layout area, cost, and operational overhead may be reduced by the integration of both types of components.

Photonics chips include detectors that convert modulated light into an electrical signal. The photodetector converts modulated pulses of light into a pulsed electrical current that furnishes the electrical signal.

Improved structures for a photodetector and methods of fabricating a structure for a photodetector are needed.

SUMMARY

In an embodiment of the invention, a structure includes a photodetector having a light-absorbing layer comprised of germanium. The structure may further include a waveguide core coupled to the light-absorbing layer. The waveguide core may be comprised of a dielectric material, such as silicon nitride. Another waveguide core, which is comprised of a different material such as single-crystal silicon, may also be coupled to the light-absorbing layer.

In an embodiment of the invention, a method includes forming a photodetector having a light-absorbing layer comprised of germanium. The method further includes forming a waveguide core coupled to the light-absorbing layer. The waveguide core may be comprised of a dielectric material, such as silicon nitride. The method may further include forming another waveguide core, which may be comprised of a different material such as single-crystal silicon, that is also coupled to the light-absorbing layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
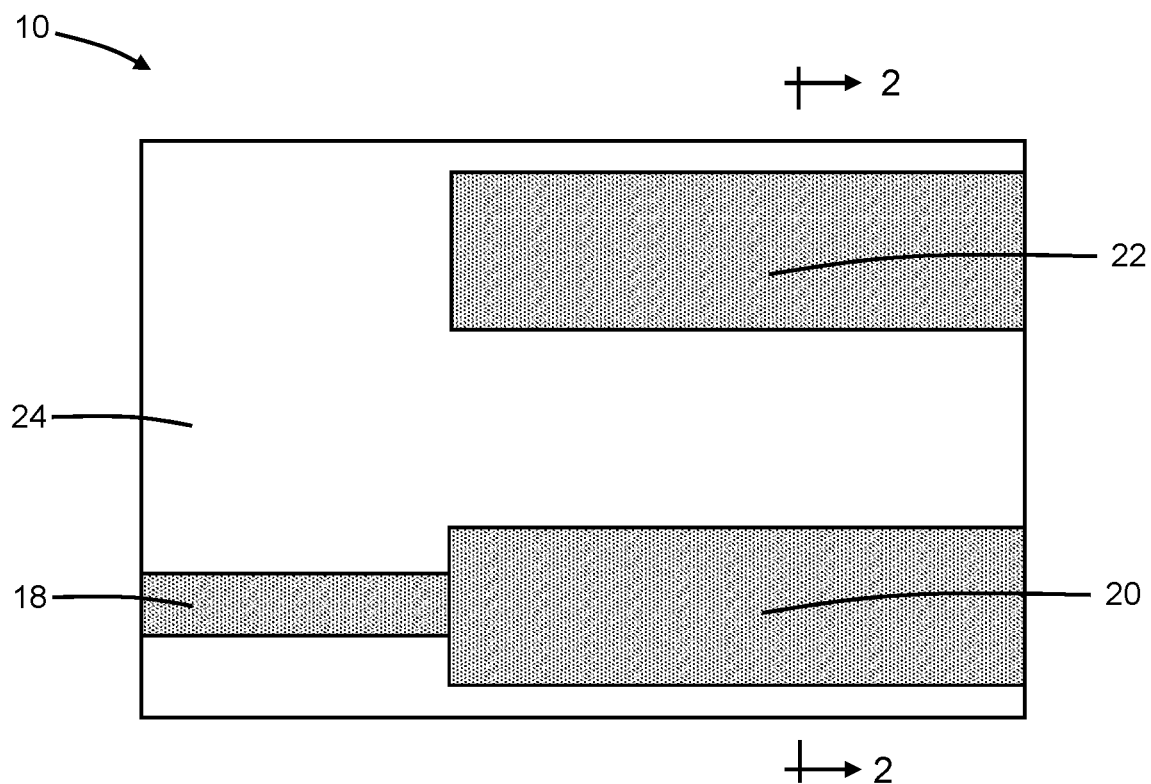
FIG. 1 is a top view of a structure at an initial fabrication stage of a processing method in accordance with embodiments of the invention.
Figure 2:
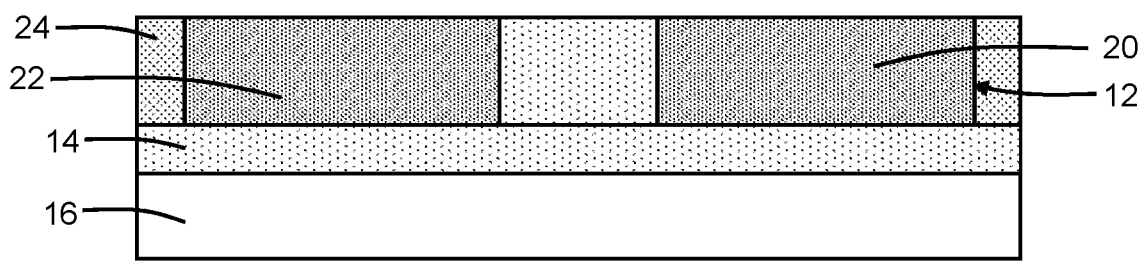
FIG. 2 is a cross-sectional view taken generally along line 2-2 in FIG. 1.

With reference to FIGS. 1, 2 and in accordance with embodiments of the invention, a structure 10 may be formed using a semiconductor-on-insulator (SOI) substrate that includes a device layer 12 defining a semiconductor layer, a buried insulator layer 14, and a handle wafer 16. The device layer 12 is separated from the handle wafer 16 by the intervening buried insulator layer 14 and may be considerably thinner than the handle wafer 16. The device layer 12 and the handle wafer 16 may contain a single-crystal semiconductor material, such as single-crystal silicon, and may be lightly doped to have, for example, p-type conductivity. The buried insulator layer 14 may be comprised of a dielectric material, such as silicon dioxide. The device layer 12 is electrically isolated from the handle wafer 16 by the buried insulator layer 14.

A waveguide core 18, a photodetector pad 20 connected to the waveguide core 18, and a photodetector pad 22 are defined in the device layer 12. The waveguide core 18, photodetector pad 20, and photodetector pad 22 may be formed by patterning trenches in the device layer 12 with lithography and etching processes, depositing a dielectric material (e.g., silicon dioxide) in the trenches to form shallow trench isolation regions 24, and planarizing with chemical-mechanical polishing. The shallow trench isolation regions 24 may penetrate fully through the device layer 12 to the buried insulator layer 14. The photodetector pad 22 may lack a connection to a waveguide core.

Figure 3:
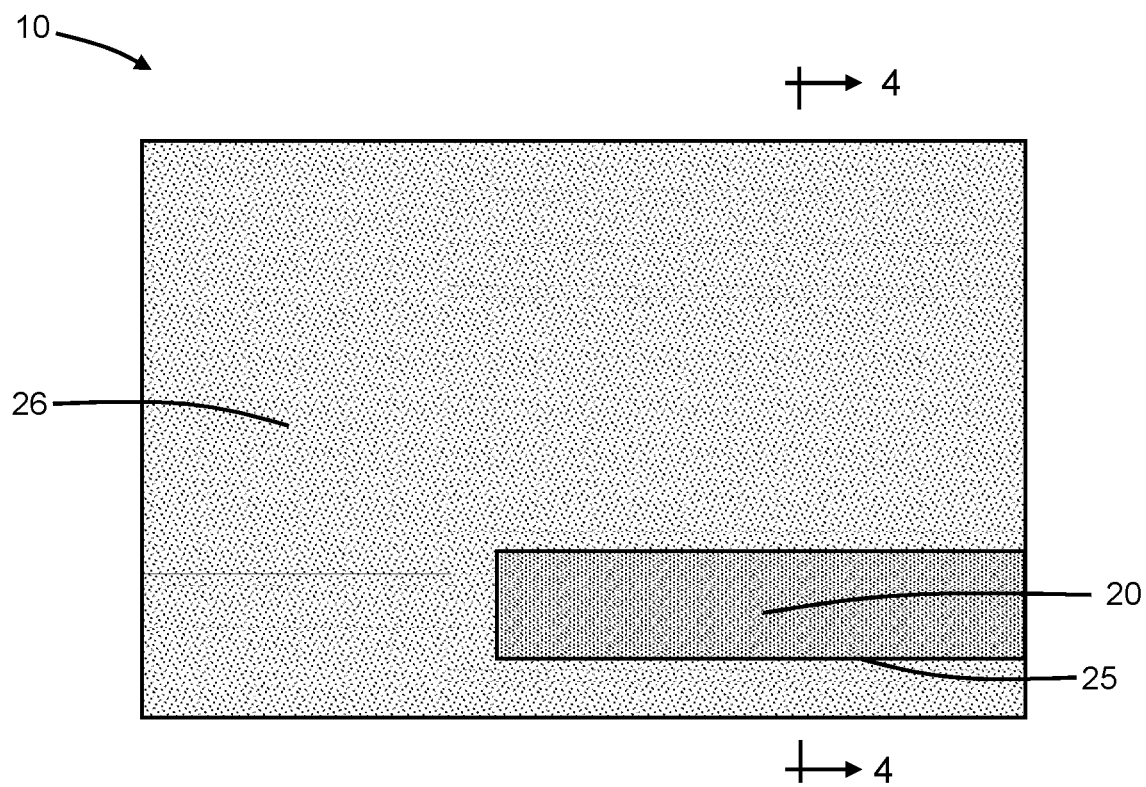
FIG. 3 is a top view of a structure at a fabrication stage of the processing method subsequent to FIG. 1.
Figure 4:
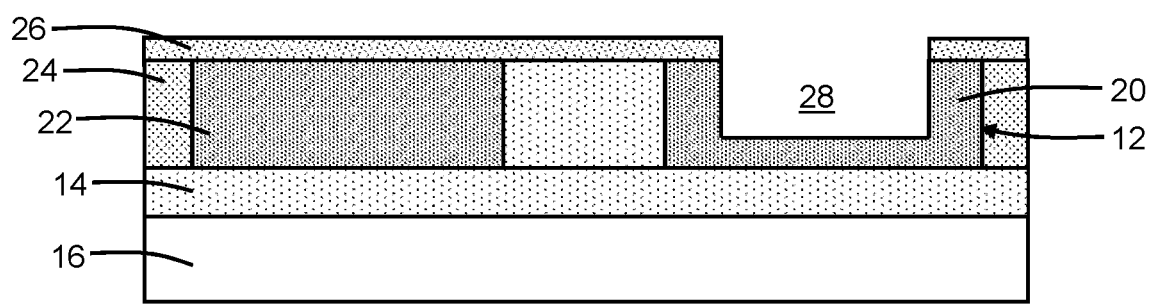
FIG. 4 is a cross-sectional view taken generally along line 4-4 in FIG. 3.

With reference to FIGS. 3, 4 in which like reference numerals refer to like features in FIGS. 1, 2 and at a subsequent fabrication stage, a dielectric layer 26 may be deposited and patterned by lithography and etching processes to define a window or opening 25. The dielectric layer 26 may be composed of a dielectric material, such as silicon nitride. The opening 25, which penetrates fully through the dielectric layer 26, exposes an area on the top surface of the device layer 12 over the photodetector pad 20. The exposed area is only a portion (i.e., a fraction) of the total area of the photodetector pad 20. The etching process may remove the material of the dielectric layer 26 selective to the material of the device layer 12. As used herein, the terms "selective" and "selectivity" in reference to a material removal process (e.g., etching) denote that the material removal rate (i.e., etch rate)

for the targeted material is higher than the material removal rate (i.e., etch rate) for at least another material exposed to the material removal.

A trench 28 is formed in the photodetector pad 20 and penetrates in depth partially through the device layer 12. The trench 28 may be formed by an etching process, such as a reactive ion etching process. The patterned dielectric layer 26 functions as an etch mask during the etching process, and the opening 25 in the patterned dielectric layer 26 defines the location in the photodetector pad 20 for the trench 28. The lateral dimensions of the trench 28 are less than the area of the photodetector pad 20. As a result, the trench 28 is surrounded in a tub in the photodetector pad 20 and the tub is bounded by the semiconductor material of the device layer 12. Surfaces of the device layer 12 are exposed at the bottom of the trench 28 and at all sides of the trench 28.

Figure 5:
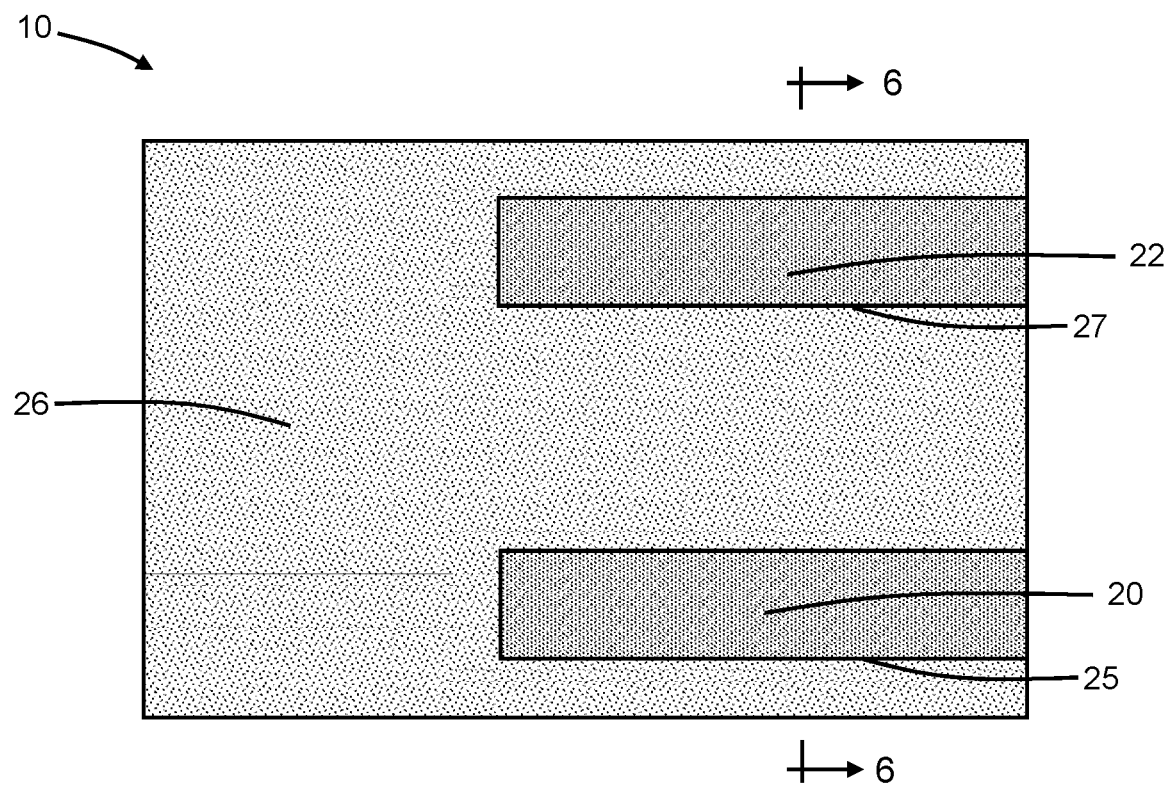
FIG. 5 is a top view of a structure at a fabrication stage of the processing method subsequent to FIG. 3.
Figure 6:
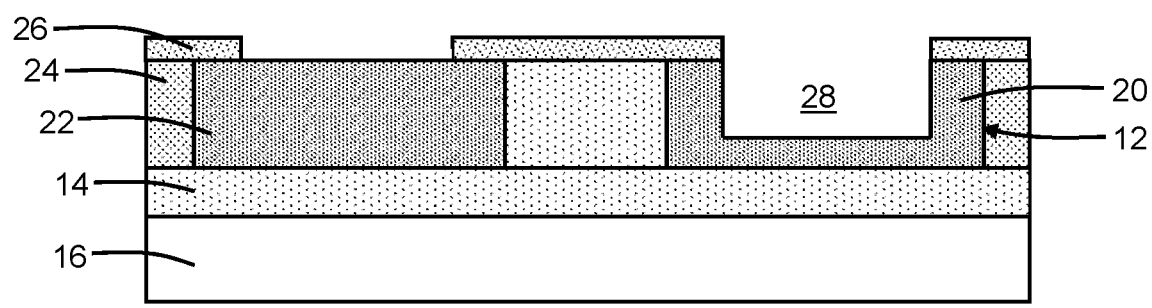
FIG. 6 is a cross-sectional view taken generally along line 6-6 in FIG. 5.

With reference to FIGS. 5, 6 in which like reference numerals refer to like features in FIGS. 3, 4 and at a subsequent fabrication stage, the dielectric layer 26 is patterned by lithography and etching processes to define a window or opening 27. The opening 27, which penetrates fully through the dielectric layer 26, exposes an area on the top surface of the device layer 12 over the photodetector pad 22. The exposed area is only a portion (i.e., a fraction) of the total area of the photodetector pad 22. The etching process may remove the material of the dielectric layer 26 selective to the material of the device layer 12.

Figure 7:
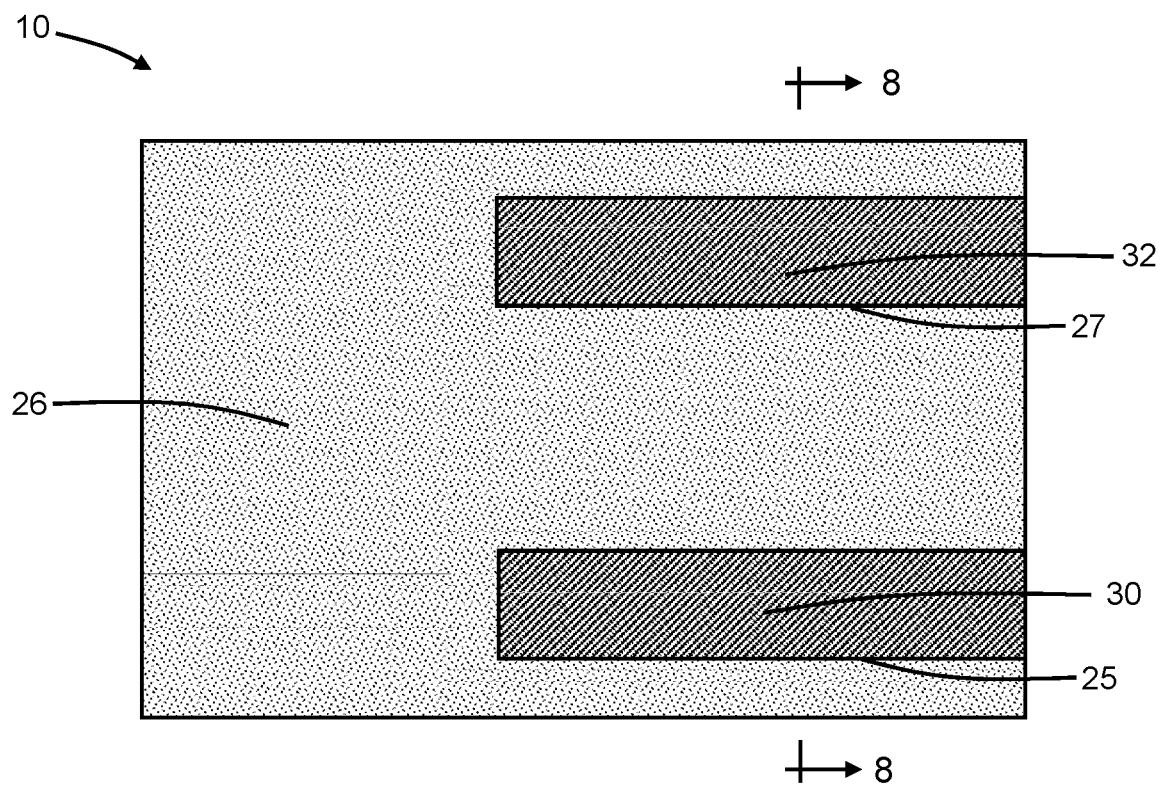
FIG. 7 is a top view of a structure at a fabrication stage of the processing method subsequent to FIG. 5.
Figure 8:
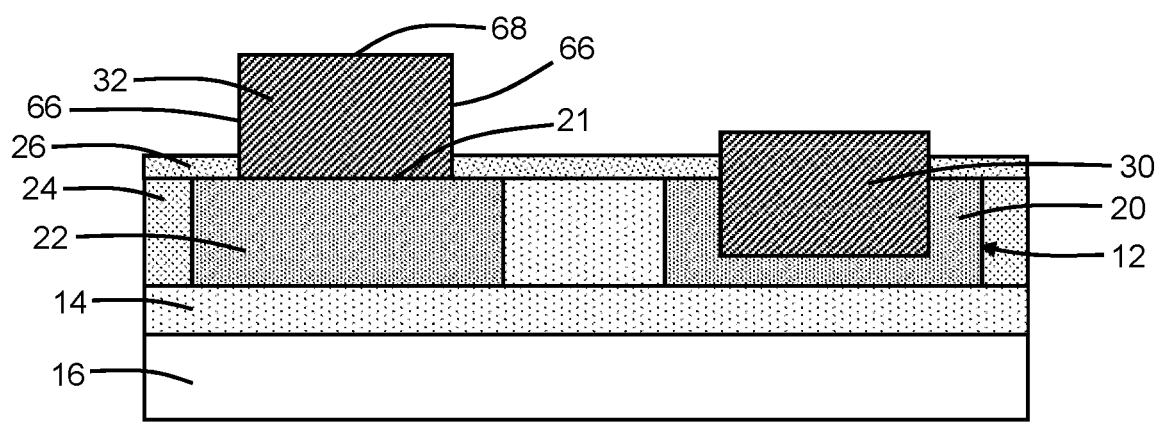
FIG. 8 is a cross-sectional view taken generally along line 8-8 in FIG. 7.

With reference to FIGS. 7, 8 in which like reference numerals refer to like features in FIGS. 5, 6 and at a subsequent fabrication stage, a light-absorbing layer 30 is formed by depositing a light-absorbing material in the trench 28 in the photodetector pad 20. A light-absorbing layer 32 is formed by depositing a light-absorbing material on the area of the top surface of the device layer 12 over the photodetector pad 22 that is exposed by the opening 27 in the dielectric layer 26. In an embodiment, the light-absorbing layers 30, 32 may be concurrently formed by a chemical vapor deposition process. In an embodiment, the light-absorbing layers 30, 32 may have a composition that includes germanium. In an embodiment, the light-absorbing layers 30, 32 may exclusively contain elemental germanium.

In an embodiment, the light-absorbing layers 30, 32 may be selectively deposited such that material does not deposit on the dielectric material of the dielectric layer 26. For example, the surfaces of the device layer 12 bordering the trench 28 in the photodetector pad 20 and the exposed area of the photodetector pad 22 may be subjected to a surface preparation process, followed by chemical vapor deposition of germanium, which grows only where the semiconductor surfaces of the device layer 12 are exposed, leading to selective deposition and minimization of threading dislocation density. Subsequent to the formation of the light-absorbing layers 30, 32, the dielectric layer 26 may be removed by an etching process selective to the materials of the device layer 12, shallow trench isolation regions 24, and light-absorbing layers 30, 32.

The light-absorbing layer 30 defines a light-absorbing region of a photodetector. The light-absorbing layer 30 is formed inside the trench 28 such that the light-absorbing material is partially embedded in the photodetector pad 20. In the representative embodiment, the light-absorbing layer 30 projects above the top surface of the waveguide core 18. In an alternative embodiment, the light-absorbing layer 30 may be coplanar with the top surface of the waveguide core 18.

The light-absorbing layer 32 defines a light-absorbing region of another photodetector that is distinct from the light-absorbing region defined by the light-absorbing layer 30. The light-absorbing layer 32 is formed on a top surface 21 of the photodetector pad 22 such that the light-absorbing material is not embedded in a trench formed in the photodetector pad 22. In an embodiment, the light-absorbing layer 32 may be formed directly on the top surface 21 of the photodetector pad 22. In an alternative embodiment, a trench similar to trench 28 may be formed in the photodetector pad 22 such that the light-absorbing layer 32 is partially embedded in the photodetector pad 22. The light-absorbing layer 32 includes a side surface 33, opposite side surfaces 66 that are aligned transverse to the side surface 33, and a top surface 68. The light-absorbing layer 32 has a width dimension measured between the opposite side surfaces 66.

Figure 9:
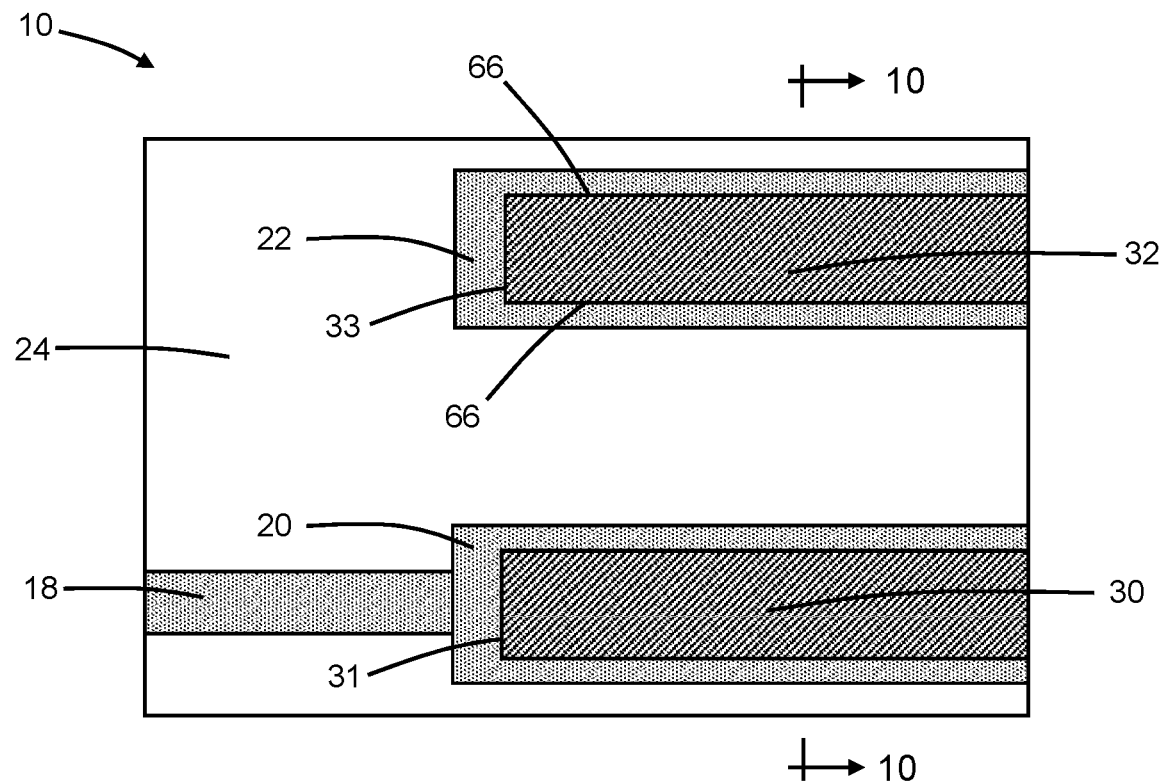
FIG. 9 is a top view of a structure at a fabrication stage of the processing method subsequent to FIG. 7.
Figure 10:
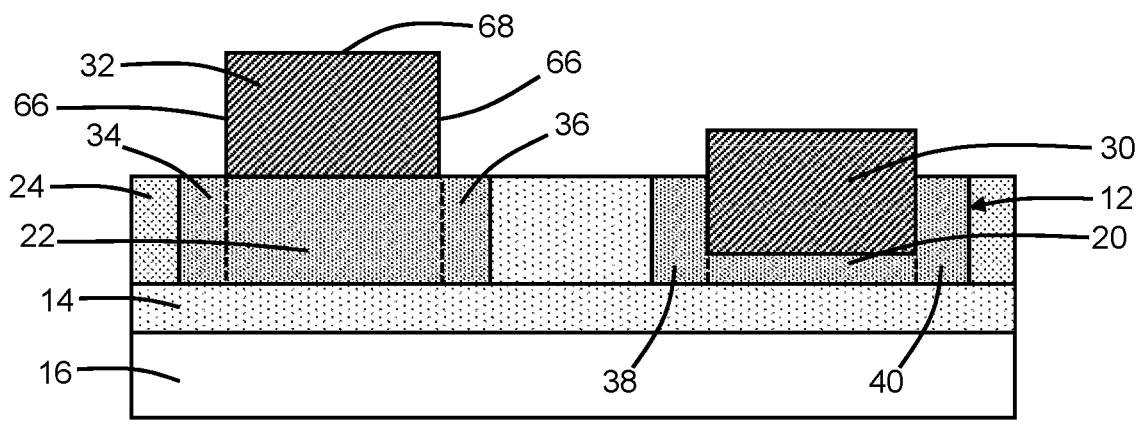
FIG. 10 is a cross-sectional view taken generally along line 10-10 in FIG. 9.

With reference to FIGS. 9, 10 in which like reference numerals refer to like features in FIGS. 7, 8 and at a subsequent fabrication stage, doped regions 34, 36 are formed in respective portions of the photodetector pad 20, and doped regions 38, 40 are formed in respective portions of the photodetector pad 22. The doped regions 34, 36 and the doped regions 38, 40 may extend through the entire thickness of the device layer 12 to the buried insulator layer 14. The doped region 34 and the doped region 36 may be arranged at the opposite side edges of the light-absorbing layer 30 to define an anode and a cathode of a photodetector that includes the light-absorbing layer 30. Similarly, the doped region 38 and the doped region 40 may be arranged at the opposite side edges of the light-absorbing layer 32 to define an anode and a cathode of a photodetector that includes the light-absorbing layer 32.

The doped region 34 and the doped region 38 may be formed by, for example, ion implantation with an implantation mask with openings that determine the implanted areas of the photodetector pads 20, 22. The implantation mask may include a layer of a light-sensitive material, such as a photoresist, applied by a spin-coating process, pre-baked, exposed to light projected through a photomask, baked after exposure, and developed with a chemical developer to define openings arranged over the areas to be implanted. The implantation conditions (e.g., ion species, dose, kinetic energy) may be selected to tune the electrical and physical characteristics of the doped region 34 and the doped region 38. The implantation mask may be stripped after forming the doped region 34 and the doped region 38. In an embodiment, the semiconductor material of the doped region 34 and the doped region 38 may contain a p-type dopant (e.g., boron) that provides p-type electrical conductivity.

The doped region 36 and the doped region 40 may be formed by, for example, ion implantation with an implantation mask with openings that determine the implanted areas of the photodetector pads 20, 22. The implantation mask may include a layer of a light-sensitive material, such as a photoresist, applied by a spin-coating process, pre-baked, exposed to light projected through a photomask, baked after exposure, and developed with a chemical developer to define openings arranged over the areas to be implanted. The implantation conditions (e.g., ion species, dose, kinetic energy) may be selected to tune the electrical and physical characteristics of the doped region 36 and the doped region 40. The implantation mask may be stripped after forming the doped region 36 and the doped region 40. In an embodiment, the semiconductor material of the doped region 36 and the doped region 40 may contain an n-type dopant (e.g., phosphorus and/or arsenic) that provides n-type electrical conductivity.

Figure 11:
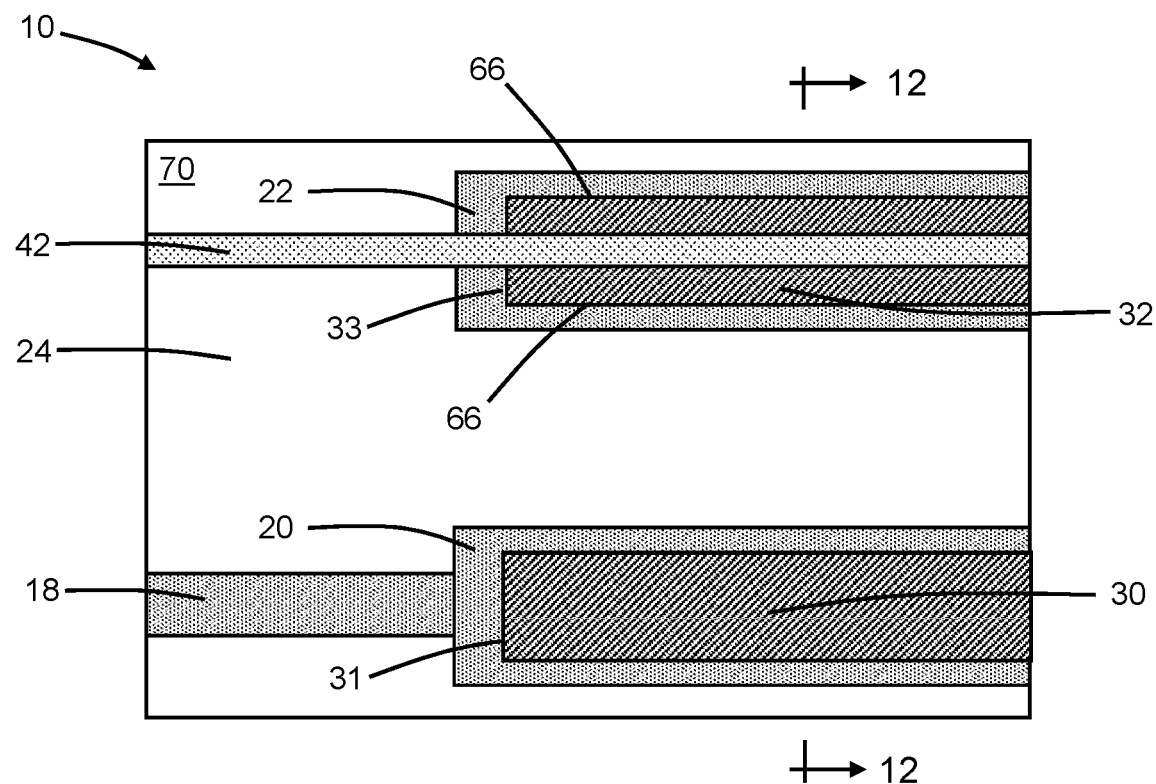
FIG. 11 is a top view of a structure at a fabrication stage of the processing method subsequent to FIG. 9.
Figure 12:
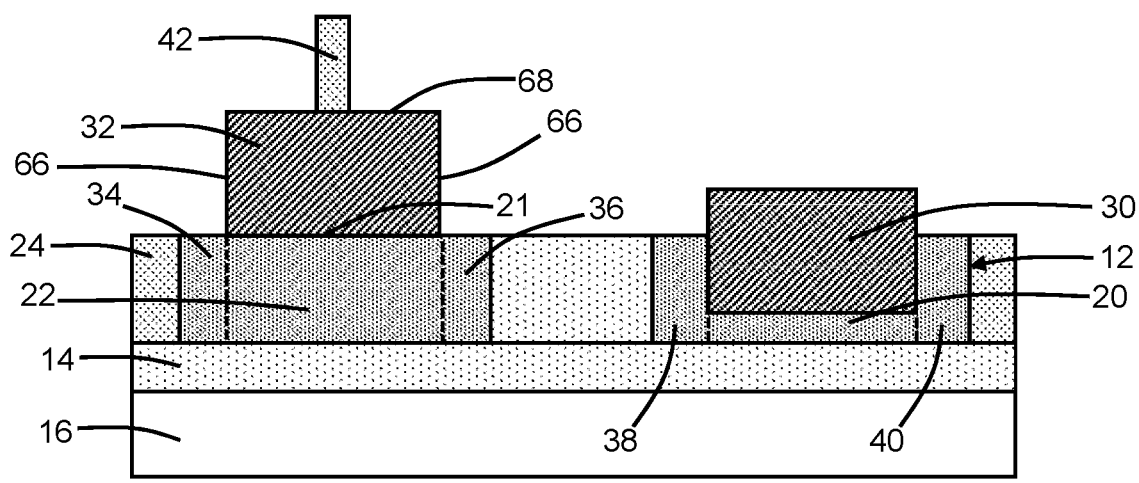
FIG. 12 is a cross-sectional view taken generally along line 12-12 in FIG. 11.

With reference to FIGS. 11, 12 in which like reference numerals refer to like features in FIGS. 9, 10 and at a subsequent fabrication stage, a waveguide core 42 is formed that is coupled to the light-absorbing layer 32. The waveguide core 42 directs laser light to the light-absorbing layer 32 for conversion of the arriving photons into electrical carriers. The waveguide core 42 may be formed by depositing a layer of a dielectric material, such as silicon nitride, and patterning the deposited layer with lithography and etching processes.

The waveguide core 42 includes a portion positioned adjacent to the side surface 33 of the light-absorbing layer 32 and a portion on the top surface 68 of the light-absorbing layer 32. The waveguide core 42 extends across the side surface 33 at which the different portions are joined. In the representative embodiment, the waveguide core 42 is narrower in width than the light-absorbing layer 32 such that the side surfaces 66 of the light-absorbing layer 32 are not covered. In an embodiment, the waveguide core 42 may be in direct contact with the top surface 68 of the light-absorbing layer 32.

Middle-of-line (MOL) processing and back-end-of-line (BEOL) processing follow, which includes formation of silicide, contacts, vias, and wiring for an interconnect structure that is coupled with the photodetectors. In particular, contacts extend in a dielectric layer of the interconnect structure to the doped regions 34, 36 and to the doped regions 38, 40. Heavily-doped regions may be provided in the doped regions 34, 36 and in the doped regions 38, 40 and may function to lower the contact resistance. The light-absorbing layers 30, 32 are not contacted by contacts in the interconnect structure.

One of the completed photodetectors includes the doped region 34 as an anode, the doped region 38 as a cathode, and the light-absorbing layer 30 as a light-absorbing region. The waveguide core 18 is effectively abutted with a side edge 31 of the light-absorbing layer 30 with a narrow section of the photodetector pad 20 intervening between the waveguide core 18 and the light-absorbing layer 30. The other of the completed photodetectors includes the doped region 36 as an anode, the doped region 40 as a cathode, and the light-absorbing layer 32 as a light-absorbing region. The waveguide core 42 is abutted with the side surface 33 of the light-absorbing layer 32 in the photodetector pad 20 and also includes a portion that extends across a top surface 68 of the light-absorbing layer 32 to provide evanescent coupling.

In use, laser light may be guided by the waveguide core 18 to the light-absorbing layer 30, which absorbs the photons of light and generates charge carriers. The biasing of the doped regions 34, 36 collects the generated charge carriers to provide a photocurrent as an output. Similarly, laser light may be guided by the waveguide core 42 to the light-absorbing layer 32, which absorbs the photons of light and generates charge carriers. The biasing of the doped regions 38, 40 collects the generated charge carriers to provide a photocurrent as an output.

The structure 10, in any of its embodiments described herein, may be monolithically integrated into a photonics chip 70 that includes both electronic components and optical components. For example, the electronic components of the photonics chip 70 may include field-effect transistors that are fabricated by CMOS front-end-of-line (FEOL) processing, and the optical components of the photonics chip 70 may include optical switches, grating couplers, etc.

Figure 13:
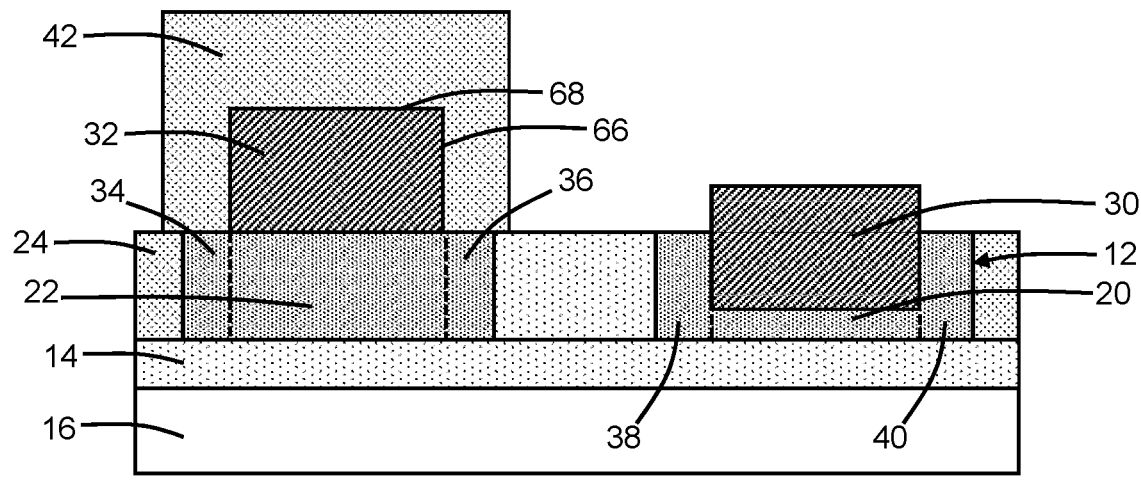
FIG. 13 is a cross-sectional view in accordance with alternative embodiments of the invention.

With reference to FIG. 13 in which like reference numerals refer to like features in FIG. 12 and in accordance with alternative embodiments, the photodetector including the light-absorbing layer 32 may be modified to widen the waveguide core 42. In particular, the waveguide core 42 may be wider than the width dimension of the light-absorbing layer 32 such that the top surface 68 of the light-absorbing layer 32 and the side surfaces 66 of the light-absorbing layer 32 are covered by the dielectric material of the waveguide core 42. In that regard, the waveguide core 42 is positioned on the top surface 68 of the light-absorbing layer 32 and overlaps with the side surfaces 66. The widening of the waveguide core 42 may be effective to increase the evanescent coupling of laser light from the waveguide core 42 to the light-absorbing layer 32.

Figure 14:
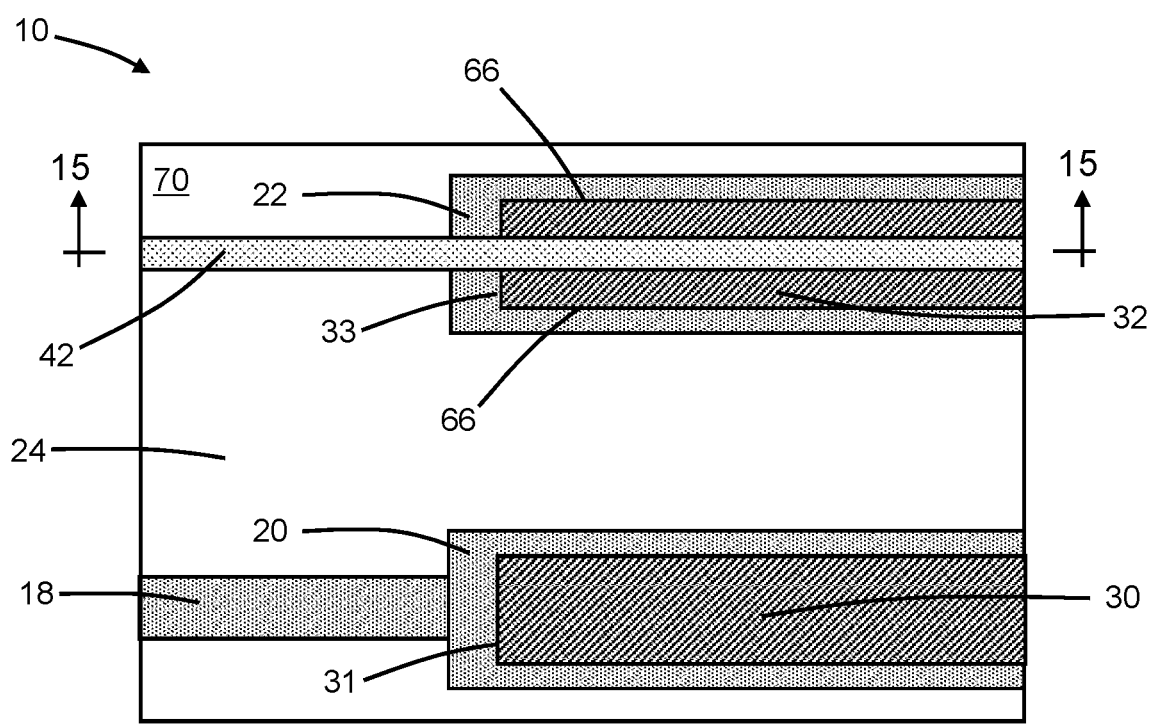
FIG. 14 is a top view of a structure in accordance with alternative embodiments of the invention.
Figure 15:
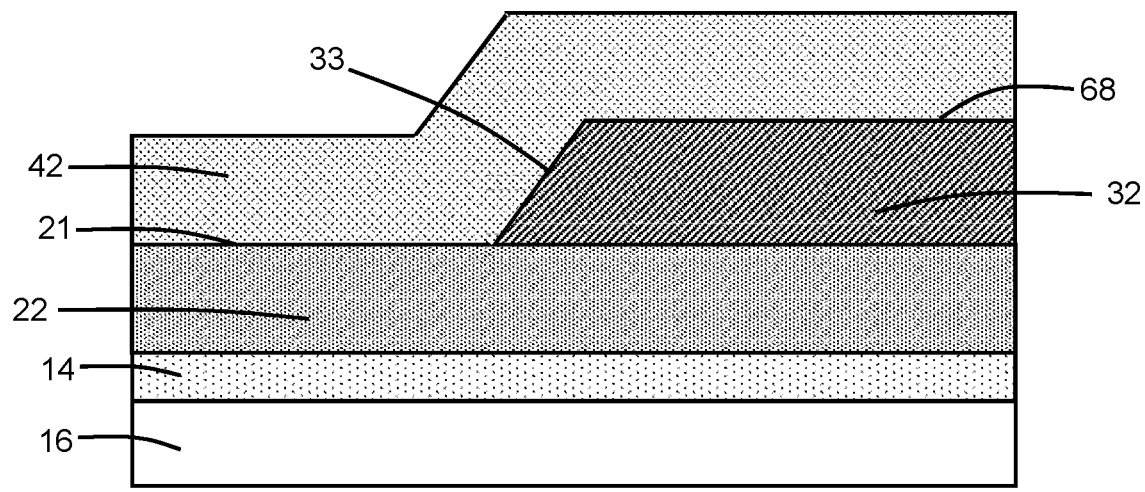
FIG. 15 is a cross-sectional view taken generally along line 15-15 in FIG. 14.

With reference to FIGS. 14, 15 in which like reference numerals refer to like features in FIGS. 11, 12 and in accordance with alternative embodiments, the light-absorbing layer 32 may include a faceted side surface 33, which may be produced through control over the epitaxial growth process used to form the light-absorbing layer 32. The waveguide core 42 may extend across the faceted side surface 33 onto the top surface 68 of the light-absorbing layer 32. The faceted side surface 33 is inclined at an acute angle relative to the plane of the top surface 21 of the photodetector pad 22. The faceting of the side surface 33 may be effective to reduce reflection of the arriving laser light.

Figure 16:
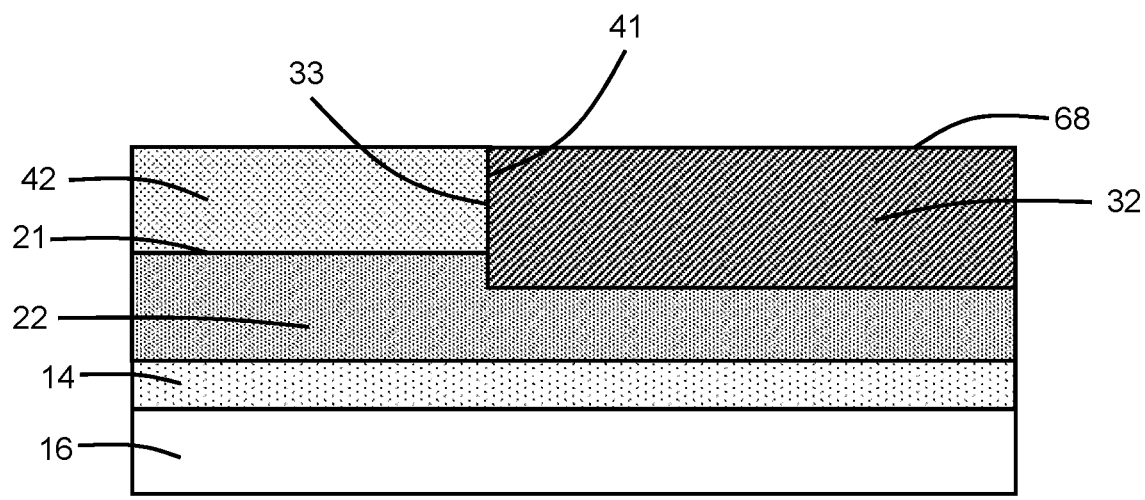
FIG. 16 is a cross-sectional view of a structure in accordance with alternative embodiments of the invention.

With reference to FIG. 16 in which like reference numerals refer to like features in FIG. 15 and in accordance with alternative embodiments, the photodetector including the light-absorbing layer 32 may be modified by a masked etch to remove the portion of the waveguide core 42 from the top surface 68 of the light-absorbing layer 32. As a result, the waveguide core 42 is terminated by a side surface 41, and the side surface 41 of the waveguide core 42 is abutted with the side surface 33 of the light-absorbing layer 32.

Figure 17:
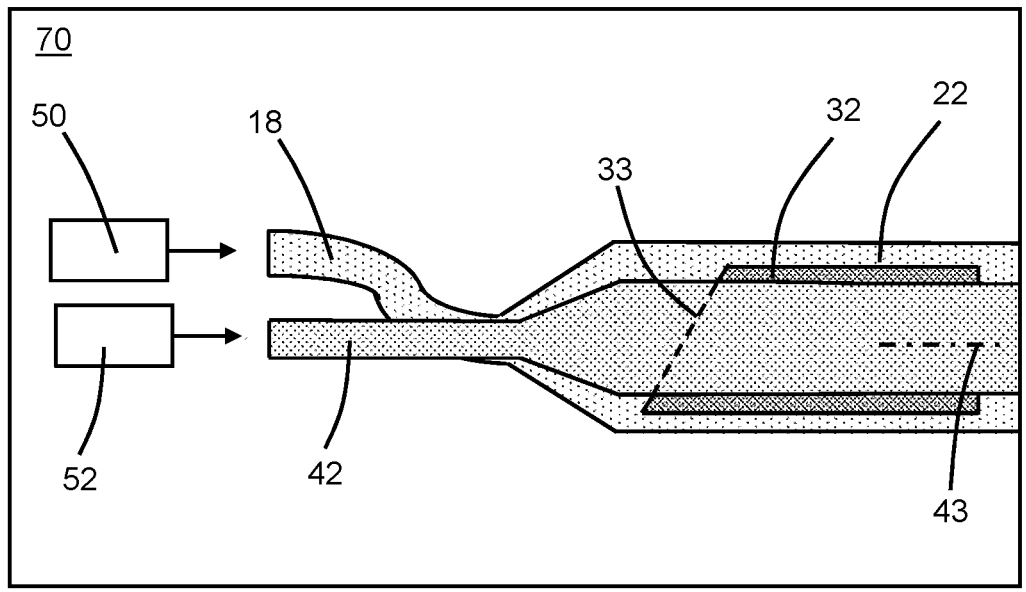
FIGS. 17 and 18 are schematic top views of structures in accordance with alternative embodiments of the invention.

With reference to FIG. 17 in which like reference numerals refer to like features in FIG. 11 and in accordance with alternative embodiments, the waveguide core 18 and the waveguide core 42 may be coupled to a shared light-absorbing layer 32 that is located in the photodetector pad 22. The waveguide core 42 is arranged in part along a longitudinal axis 43 over a portion of the waveguide core 18 and over the light-absorbing layer 32. The waveguide core 18 and the waveguide core 42 both intersect the light-absorbing layer 32 at the side surface 33. The side surface 33 of the light-absorbing layer 32 may be angled laterally such that the longitudinal axis 43 of the waveguide core 42 intersects the side surface 33 at an acute angle or an obtuse angle instead of perpendicularly at a right angle. The angling of the side surface 33 may function to reduce reflection of the arriving laser light. The waveguide core 42 may extend across the angled side surface 33 and onto the top surface 68 of the light-absorbing layer 32.

The waveguide core 18 and the waveguide core 42 may be configured to supply laser light with different polarizations to the shared light-absorbing layer 32. A light source 50 may be coupled to the waveguide core 18 and may be configured to generate laser light with a transverse magnetic (TM) polarization that is guided by the waveguide core 18 to the light-absorbing layer 32. In an embodiment, the light source 50 may include a laser and a polarization splitter-rotator. A light source 52 may be coupled to the waveguide core 42 and may be configured to generate laser light with a transverse electric (TE) polarization that is guided by the waveguide core 42 to the light-absorbing layer 32. In an embodiment, the light source 52 may include a laser.

In an alternative embodiment, the light sources 50, 52 may have a different configuration. Specifically, the light source 50 may be configured to provide laser light with a transverse electric (TE) polarization that is guided by the waveguide core 18 to the light-absorbing layer 32. In an embodiment, the light source 50 may include a laser. The light source 52 may be configured to provide laser light with a transverse magnetic (TM) polarization that is guided by the waveguide core 42 to the light-absorbing layer 32. In an embodiment, the light source 52 may include a laser, an optical coupler configured to transfer the light from the waveguide core 42 downwardly to the light-absorbing layer 32, and a polarization splitter-rotator.

Figure 18:
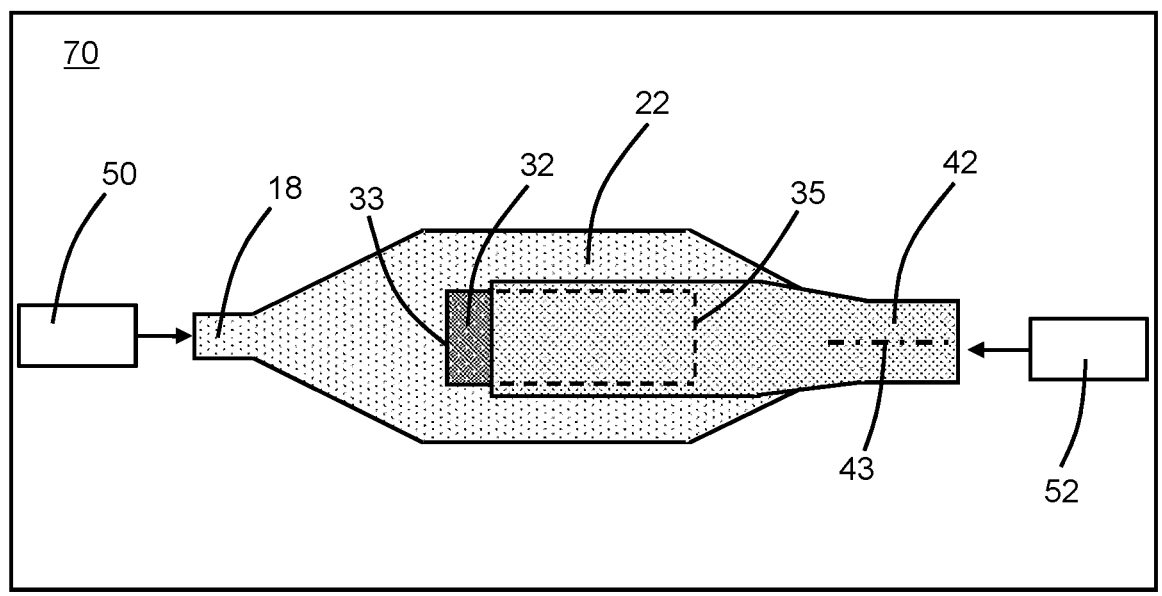

With reference to FIG. 18 in which like reference numerals refer to like features in FIG. 17 and in accordance with alternative embodiments, the waveguide cores 18, 42 may converge at the single light-absorbing layer 32 in a different manner. Specifically, the waveguide core 18 may intersect the side surface 33 of the light-absorbing layer 32, and the waveguide core 42 may intersect a side surface 35 of the light-absorbing layer 32 that is opposite to the side surface 33. The waveguide core 42 may extend across the side surface 35 and onto the top surface 68 of the light-absorbing layer 32.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a first photodetector including a first light-absorbing layer comprised of germanium; and
a first waveguide core coupled to the first light-absorbing layer, the first waveguide core comprising a dielectric material,
wherein the first light-absorbing layer includes a top surface, a first side surface, and a second side surface, the first waveguide core laterally overlaps with the first side surface, the first waveguide core laterally overlaps with the second side surface, and the first waveguide core is positioned on the top surface of the first light-absorbing layer.

2. The structure of claim 1 wherein the first light-absorbing layer includes a third side surface, the first side surface and the second side surface are aligned transverse to the third side surface, and the first waveguide core extends across the third side surface of the first light-absorbing layer to the top surface of the first light-absorbing layer.

3. The structure of claim 1 further comprising:
a second photodetector including a second light-absorbing layer comprised of germanium; and
a second waveguide core coupled to the second light-absorbing layer, the second waveguide core comprised of single-crystal silicon,
wherein the first photodetector, the first waveguide core, the second photodetector, and the second waveguide core are located on a photonics chip.

4. The structure of claim 3 wherein the dielectric material of the first waveguide core is silicon nitride.

5. The structure of claim 3 wherein the first photodetector includes a first pad comprised of single-crystal silicon, a first anode in the first pad, and a first cathode in the first pad, the first pad has a top surface, and the first light-absorbing layer is positioned on the top surface of the first pad.

6. The structure of claim 5 wherein the second photodetector includes a second pad comprised of single-crystal silicon, a second anode in the second pad, and a second cathode in the second pad, the second pad has a top surface, and the second light-absorbing layer is positioned on the top surface of the second pad.

7. The structure of claim 1 wherein the first photodetector includes a pad comprised of single-crystal silicon, an anode in the pad, and a cathode in the pad, the pad has a top surface, and the first light-absorbing layer is positioned on the top surface of the pad.

8. The structure of claim 7 wherein the first light-absorbing layer includes a third side surface, the first side surface and the second side surface are aligned transverse to the third side surface, the third side surface is inclined at an acute angle relative to the top surface of the pad, and the first waveguide core extends across the third side surface of the first light-absorbing layer.

9. The structure of claim 7 wherein the dielectric material of the first waveguide core is silicon nitride.

10. A structure comprising:
a photodetector including a light-absorbing layer comprised of germanium;
a first waveguide core coupled to the light-absorbing layer, the first waveguide core comprising a dielectric material; and
a second waveguide core coupled to the light-absorbing layer,
wherein the light-absorbing layer includes a first side surface and a second side surface opposite to the first side surface, the first waveguide core extends across the first side surface of the light-absorbing layer, and the second waveguide core is coupled to the light-absorbing layer at the first side surface.

11. The structure of claim 10 wherein the dielectric material of the first waveguide core is silicon nitride, and the second waveguide core comprises single-crystal silicon.

12. The structure of claim 10 wherein the first waveguide core extends along a longitudinal axis, and the first waveguide core intersects the first side surface of the first light-absorbing layer at an acute angle or an obtuse angle.

13. The structure of claim 10 further comprising:
a first source configured to supply first laser light of transverse electric mode that is guided by the first waveguide core to the light-absorbing layer; and
a second source configured to supply second laser light of transverse magnetic mode that is guided by the second waveguide core to the light-absorbing layer.

14. The structure of claim 10 further comprising:
a first source configured to supply first laser light of transverse magnetic mode that is guided by the first waveguide core to the light-absorbing layer; and
a second source configured to supply second laser light of transverse electric mode that is guided by the second waveguide core to the light-absorbing layer.

15. The structure of claim 10 wherein the photodetector includes a pad comprised of single-crystal silicon, an anode in the pad, and a cathode in the pad, the pad has a top surface, and the light-absorbing layer is positioned on the top surface of the pad.

16. A structure comprising:
a photodetector including a light-absorbing layer comprised of germanium;
a first waveguide core coupled to the light-absorbing layer, the first waveguide core comprising a dielectric material; and
a second waveguide core coupled to the light-absorbing layer,
wherein the light-absorbing layer includes a first side surface and a second side surface opposite to the first side surface, the first waveguide core extends across the second side surface of the light-absorbing layer, and the second waveguide core is coupled to the light-absorbing layer at the first side surface of the light-absorbing layer.

17. The structure of claim 16 further comprising:
a first source configured to supply first laser light of transverse electric mode that is guided by the first waveguide core to the light-absorbing layer; and
a second source configured to supply second laser light of transverse magnetic mode that is guided by the second waveguide core to the light-absorbing layer.

18. The structure of claim 16 further comprising:
a first source configured to supply laser light of transverse magnetic mode that is guided by the first waveguide core to the light-absorbing layer; and
a second source configured to supply second laser light of transverse electric mode that is guided by the second waveguide core to the light-absorbing layer.

19. The structure of claim 16 wherein the photodetector includes a pad comprised of single-crystal silicon, an anode in the pad, and a cathode in the pad, the pad has a top surface, and the light-absorbing layer is positioned on the top surface of the pad.

20. The structure of claim 16 wherein the dielectric material of the first waveguide core is silicon nitride, and the second waveguide core comprises single-crystal silicon.

* * * * *